United States Patent [19]

Crookshanks

[11] Patent Number: 4,652,816

[45] Date of Patent: Mar. 24, 1987

[54] CALIBRATED RADIO FREQUENCY ANALOG SPECTRUM ANALYZER

[75] Inventor: Rex J. Crookshanks, Palos Verdes Estates, Calif.

[73] Assignee: Hughes Aircraft Company, Los Angeles, Calif.

[21] Appl. No.: 679,323

[22] Filed: Dec. 7, 1984

[51] Int. Cl.[4] .............................................. G01R 23/16
[52] U.S. Cl. .................................. 324/77 B; 364/571; 324/77 R
[58] Field of Search .................. 364/571, 573, 579; 333/156, 160, 245; 328/184; 324/77 B, 77 C, 77 CS, 77 R, 77 G, 77 H, 77 K

[56] References Cited

U.S. PATENT DOCUMENTS

| | | | |
|---|---|---|---|
| 3,939,411 | 2/1976 | James | 324/77 H |
| 4,310,816 | 1/1982 | Fuller | 333/245 |
| 4,446,566 | 5/1984 | Fuller | 324/77 H |

*Primary Examiner*—Michael J. Tokar
*Attorney, Agent, or Firm*—J. A. Sawyer, Jr.; M. J. Meltzer; A. W. Karambelas

[57] ABSTRACT

An analog radio frequency spectrum analyzer (10) includes a calibration section (30) for compensating distortions. The spectrum analyzer includes a first reflective array compressor or "RAC" (12), a frequency sweep section (20), and a second RAC (14). Frequency domain compensations introduced at the signal input by the calibration section compensate distortions in the time domain at the output of the spectrum analyzer. This system corrects, for example, nonlinearities in the second RAC. The calibration function is determined by a network analysis of the spectrum analyzer and is specific to the RAC included. The function is stored in a ROM or other memory as a sequence of complex digital words. An address generator (36) directs the words to a complex multiplier (32) so that each input symbol period is multiplied by the sequence. Each complex digital word corresponds to an amplitude and phase modulation of the incoming signal over a fraction of a symbol period. The resulting output of the spectrum analyzer is that which would be expected without calibration given an ideal second RAC.

5 Claims, 4 Drawing Figures

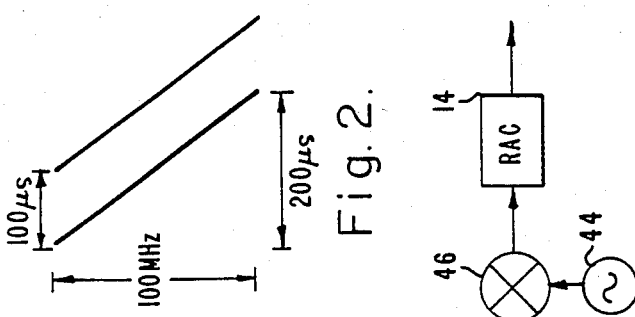
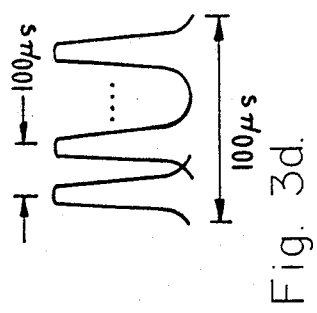
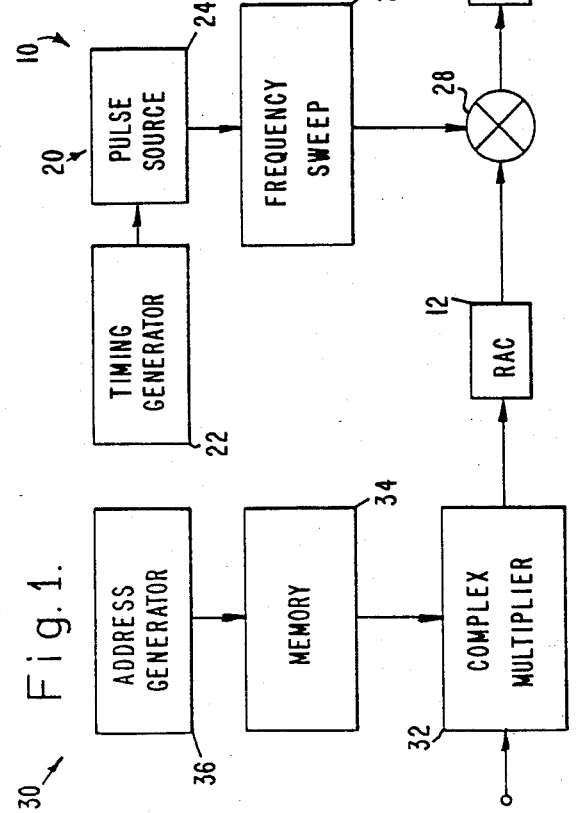
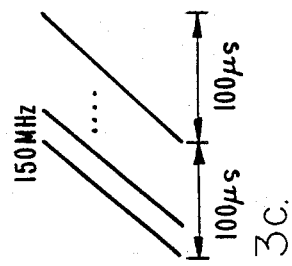
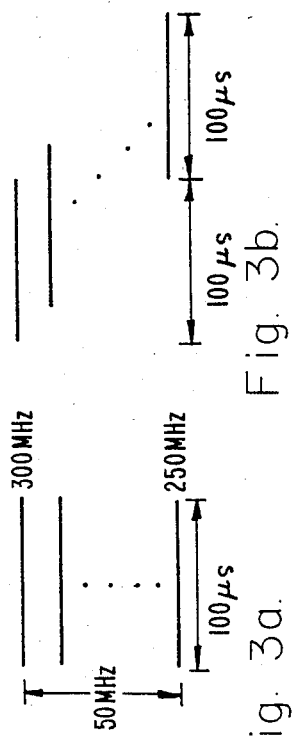

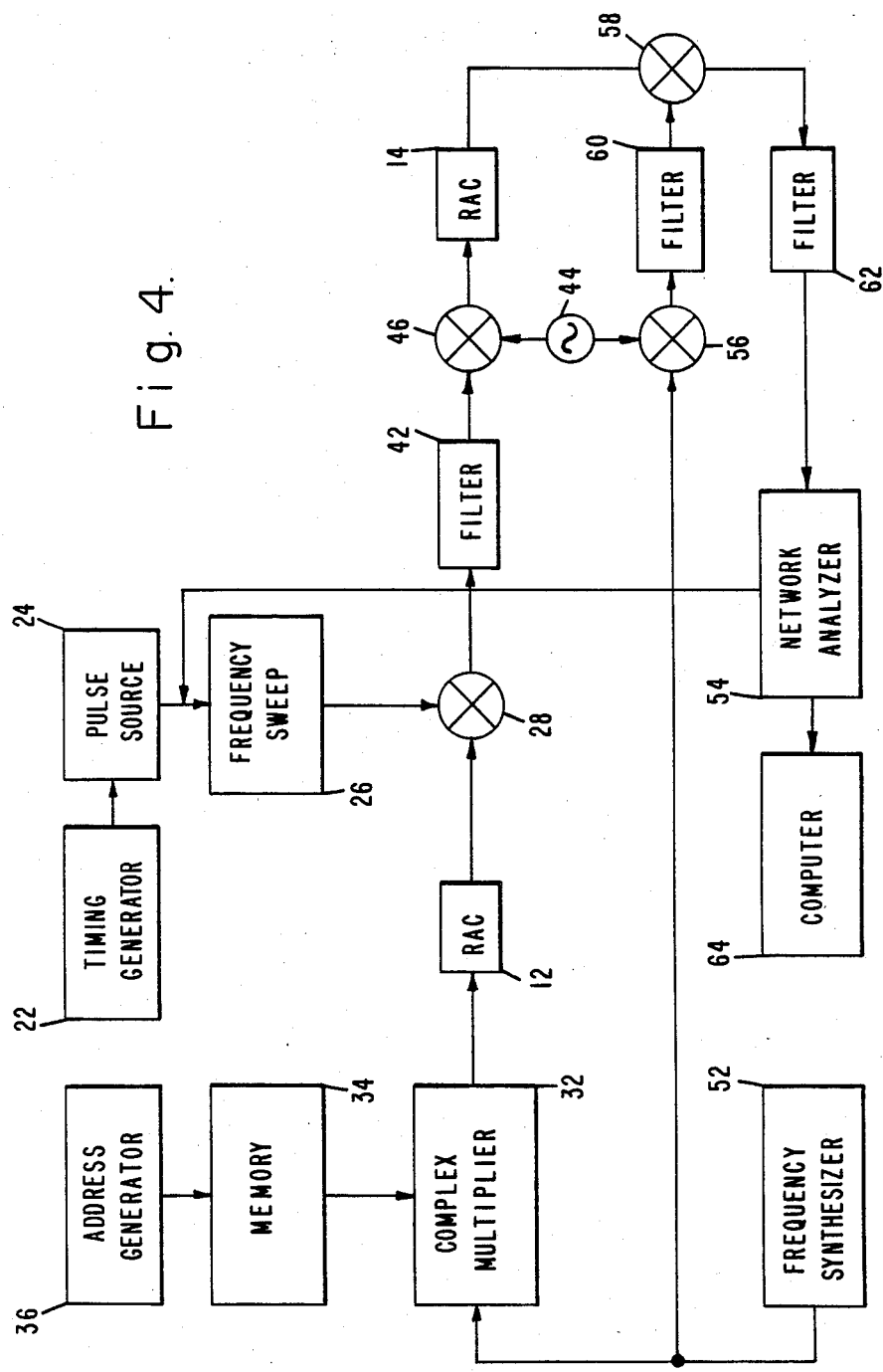

CALIBRATED RADIO FREQUENCY ANALOG SPECTRUM ANALYZER

BACKGROUND OF THE INVENTION

The present invention relates to spectrum analyzers and, more particularly, to a calibrated radio frequency analog spectrum analyzer.

Analysis of signals in the frequency domain is widely used to obtain physical and electrical system performance information. For example, manufacturers of mechanical structures, such as aircraft and bridges, can use a motion-to-electrical signal transducer. A spectrum analysis of the resulting signal can permit monitoring of vibration components associated with imbalance and worn bearings and gears. In addition, a system's natural modes of vibration can be identified.

Spectrum analyzers are also used in electronic testing to assess non-linear effects of amplification, mixing and filtering, to determine the purity of signals, to measure radio frequency power, frequency and modulation characteristics, and to provide amplitude analysis of electrical networks. In telecommunications, transceivers and multiplex systems are assessed with respect to their spectrum, modulation, wave and audio characteristics.

Of central concern herein, is the use of spectrum analyzers for determining the spectral components of a radio frequency (rf) signal. A communications system, for example, can incorporate such a spectrum analyzer to transform a frequency division multiplexed (FDM) signal to a time division multiplexed (TDM) signal.

Spectrum analysis can be performed digitally by employing a Fourier transformation. For some applications, the computational power requirements for a desired input bandwidth are impractical. This is particularly true in satellite communications where system power and weight are severely constrained. In addition, the digital processing introduces undesirable delays. Furthermore, it is difficult to build sufficiently high speed analog-to-digital converters.

Analog spectrum analyzers offer the prospect of near real time transformations without great demands on processing power. Traditional analog spectrum analyzers either employ filter banks or swept filters. Filter banks are very bulky while swept filters are unsuitable for some applications such as demodulators where it is necessary to sample each frequency continuously.

Analog spectrum analyzers are known which include a pair of frequency x delay dispersion sections with an intervening frequency sweep section. The first dispersion section introduces delays as a function of frequency to an incoming signal, such as a FDM signal. The frequency sweep signal converts the frequency components of the dispersed FDM signal into a series of sweeps. The second dispersion section collapses each sweep into a pulse so that the series of sweeps becomes description of the spectrum of the input signal.

The dispersion sections in such devices include devices generically classified as dispersive filters. These filters are also known as surface acoustic wave (SAW) dispersive or linear frequency modulated chirp filters. The first such devices were based on interdigital electrode transducers (IDTs). The IDT consists of a set of interleaved metal electrodes deposited on the surface of a set of piezoelectric substrate, normally quartz. However, IDT based spectrum analyzers have not provided the time-bandwidth product sufficient for some satellite communications applications.

More recently, devices with greater time-bandwidth products have been provided using reflective array compressors (RACs). The RAC can be manufactured by etching into a crystalline substrate, e.g. lithium niobate, a multitude of slits, e.g. 8,000, each tuned to reflect a given frequency. By reflecting different frequencies at different slits, and thus different locations, differential delays are introduced in a throughgoing signal as a function of frequency.

RACs are difficult to manufacture with the precision required for satellite applications. Furthermore, the cost of manufacturing a single RAC renders impractical the discarding of RACs not meeting design specifications. What is needed is an analog spectrum analyzer with the time-bandwidth product of RAC based devices, but without vulnerability to RAC imperfections.

SUMMARY OF THE INVENTION

In accordance with the present invention, a spectrum analyzer provides for compensation of distortions introduced by dispersion filters. The spectrum analyzer includes two dispersion sections and an intermediate frequency sweep section. A calibration section processes a throughgoing signal according to a function corresponding to the distortions introduced by one or more of the dispersion sections.

In one realization of the invention, the spectrum analyzer is designed to convert FDM signals to TDM signals. The calibration section preprocesses the incoming signal prior to the introduction of delays by the first dispersion section. The calibration section processes the signal by multiplying it by a calibration function. The calibration function can be in the form of a series of complex digital words permitting amplitude and phase variations upon the incoming signal. The complex digital words can include a sign bit so that inversions as well as scaling can be introduced, and so that the power level of the output can be adjusted to that of the input.

The determination of a suitable calibration function is greatly simplified by the recognition that the impact of the distortions introduced by the first dispersion section is negligible in comparison to those introduced by the second dispersion section. Accordingly, the calibration function can be determined by a network analysis of the circuit from the frequency sweep section through the second dispersion section. The results of the network analysis are subtracted from expected ideal values to determine the compensation required according to an algorithm disclosed herein.

Thus, the present invention provides for the compensation of distortions introduced by the RACs or other devices in a spectrum analyzer. Accordingly, the advantages of high time-bandwidth product analog spectrum analyzers are maintained while the problems in manufacturing precision RACs are circumvented.

BRIEF DESCRIPTION OF THE DRAWINGS

FIG. 1 is a schematic diagram of a spectrum analyzer in accordance with the present invention.

FIG. 2 is a graphic representation of the output of a frequency sweep incorporated in the spectrum analyzer of FIG. 1.

FIGS. 3a–d illustrate successive forms of a signal as it progresses through the spectrum analyzer of FIG. 1.

FIG. 4 is a schematic of the spectrum analyzer of FIG. 1 together with a network analysis system for determining calibration functions to be stored in a memory incorporated in the converter of FIG. 1.

DESCRIPTION OF THE PREFERRED EMBODIMENTS

A spectrum analyzer 10 includes first and second RACs 12 and 14, and an intermediate frequency sweep section 20 including a timing generator 22, a pulse source 24, a frequency sweep 26, and a bilinear mixer 28. The spectrum analyzer 10 serves to convert FDM signals to TDM signals. In accordance with the present invention, the spectrum analyzer 10 includes a calibration section 30 to compensate for distortions introduced by the components of the analyzer, particularly the second RAC 14.

The calibration section 30 includes a complex multiplier 32 for multiplying the incoming signal by a calibration function in the form of a series of complex digital words. The calibration function is stored in a memory 34, such as a ROM (read only memory). The individual digital words are introduced in response to signals from an address generator 36.

As a signal converter, the spectrum analyzer 10 is itself a component of an incorporating communications system which synchronizes the action of the address generator 36 of the calibration section 30 and the timing generator 22 of the frequency sweep section 20 with the onset of symbol periods of the incoming signal.

In the illustrated embodiment, the incoming FDM signals are more specifically characterized as multiplexed frequency shift keyed (MFSK) signals within a predetermined frequency range, e.g. the 50 MHz range from 250 MHz to 300 MHz. Within this range are included a multitude, e.g. 1000, narrow band channels, each assignable to a frequency shift keyed (FSK) signal.

Each FSK channel presents a stream of binary data at a predetermined common baud rate. All channels switch from one bit or symbol to the next simultaneously. By way of example, the baud rate is 10 kHz, with a corresponding symbol duration of 100 microseconds. The output of the spectrum analyzer 10 is a series of 100 microsecond segments, each comprising 1000 "pulse windows" spaced 100 nanoseconds apart. In other embodiments, the pulse spacings would be decreased to provide slack between TDM segments, and to permit the inclusion of timing information within the pulse train.

In response to cues from the incorporating communications system, the timing generator 22 fires the pulse source 24 once per symbol period, e.g. every 100 microseconds. Each pulse includes frequency components over the desired sweep range, which is twice the frequency range of the incoming signal. In the illustrated embodiment, the frequency range of the sweep is 100 MHz, i.e. 100 MHz to 200 MHz.

The frequency sweep 26 converts each pulse into a linear sweep with a maximum differential delay of twice the symbol period, e.g. 200 microseconds. In this specific example, the 100 MHz component of a given sweep exits the sweep 200 microseconds after the 200 MHz components. Thus the output of the frequency sweep 26 is a series of overlapping linear sweeps, as represented in FIG. 2.

The sequential processing of an incoming signal is described in greater detail with reference to FIGS. 3a–d. The role of the calibration section 30 is discussed after the functions of the other sections are detailed.

The incoming signal is represented in FIG. 3a and comprises 1000 synchronized FSK signals, each with an assigned channel frequency within the allotted 50 MHz range. One set of symbol segments, each 100 microseconds long, is illustrated.

The purpose of the first RAC 12 is to introduce differential delays as a function of frequency into the incoming signal. The same purpose could be served by a sequence of RACs or other dispersion filters, such as IDTs.

The delay introduced at the low end of the incoming signal frequency range is one symbol period longer than the delay introduced into the high end of the frequency range. The first RAC 12 is nominally linear so that the delays nominally introduced at intermediate frequencies are readily determined by interpolation. The originally concurrent segments of the incoming signal are staggered as they exit the first RAC 12, as indicated in FIG. 3b.

The staggered segments are mixed with the frequency sweep output at the bilinear mixer 28. The frequency sweep section 20 is synchronized with the incoming signal so that each frequency sweep sweeps an entire set of staggered segments. A post mixer filter 42 eliminates the sum term from the mixing, so that only the difference term of the product progresses through the system.

A local oscillator 44 generates a translation signal for centering the frequency range of the series of sweeps on the center frequency of the passband of the second RAC 14, which, in this embodiment is the same as that of the first RAC 12. The translation signal, which can have a frequency of 150 MHz, is mixed with the series of sweeps at a second mixer 46.

The series of sweeps has components outside the approximately 50 MHz passband of the second RAC. Hence, many components of the series of sweeps are filtered out by the second RAC 14. The components of the sweeps entering the second RAC 14 which are not going to be eliminated are represented in FIG. 3c. Each series includes 1000 sweeps and has an overall duration of 200 microseconds. Each sweep within the series has a duration of 100 microseconds.

The second RAC 14 is nominally identical to the first RAC 12. In other words, it introduces differentials as a monotonic function of frequency into the throughgoing signal. The maximum differential is 100 microseconds between the highest and lowest frequencies of the passband. The effect of the second RAC 14 is to "stand up" or collapse each sweep into a pulse. The output of the second RAC 14 is a series of pulses, as illustrated in FIG. 3d, each pulse corresponding to a sweep and hence to one of the original FSK channels.

The basic operation of the spectrum analyzer 10 having been reviewed, the effects of imperfections in the RACs 12 and 14 are now considered. Imperfections in a RAC can result in amplitude and phase deviations from the nominal monotonic, e.g. linear delay x frequency, function of the RAC.

Phase distortions introduced by the first RAC 12 result in relative timing shifts of the individual channels. In other words, a particular segment of a given channel could be advanced or retarded relative to its nominally expected position. Where the segment is advanced, the corresponding sweep includes more low frequency and less high frequency content than expected. Likewise, where a segment is retarded, the corresponding sweep includes more high frequency and less low frequency content than expected.

However, within the anticipated range of distortions, all the components within the passband of the second RAC 14 are present at its input and arrive at the proper time. Thus, errors introduced by the first RAC 12 are, for the most part, eliminated by the filtering action of the second RAC 14 and have negligible impact on the output of the spectrum analyzer 10.

Amplitude distortions introduced by the first RAC 12 result in constant relative attenuation differentials between channels. However, there is essentially no impact on amplitude differentials between successive symbols within a channel. In practice these errors are not problematic, and in any event can be dealt with in the design of the readout (not shown) of the spectrum analyzer 10.

Distortions introduced by the second RAC 14 can contribute significantly to intersymbol interference, and thus impair the performance of the spectrum analyzer 10. Phase distortions introduced by the second RAC 14 result in the misalignment of the frequency components of the pulse outputs. In other words, the durational centers of the frequency components of a given component will occur at slightly different times. This results in symbol spreading which in turn contributes to intersymbol interference. Furthermore, pulse height is reduced impairing the signal-to-noise ratio of the system.

Amplitude distortions affect the frequency distribution of the pulses. Since certain frequency distribution permit better differentiation of successive pulses, amplitude distortion also contributes to intersymbol interference.

The character of a spectrum analyzer is such that the frequency-varying time deviations at its outputs can be precompensated by introducing complementary time-varying frequency deviations at its input. Furthermore, time-varying amplitude control over the input permits control over output pulse shape so that intersymbol interference can be minimized.

The premodulation can be applied by multiplying the incoming signal by a complex time-varying function. Since the function is complex, both phase and amplitude can be modified. In the illustrated embodiment, the complex multiplier 32 is designed to multiply the incoming analog signal by a series of complex digital words, including a sign bit. Thus the calibration function is represented in a memory by a series of complex digital words, numbering, for example, 128. These are applied seriatum in response to signals from the address generator 36.

The series of digital words, or the calibration function in whatever form it takes, is tailored to the specific second RAC 14. In order to determine the calibration function to be applied by the complex multiplier 32 to the incoming signal, the calibration set up of FIG. 4 is used. A frequency synthesizer 52 is used to introduce a sine wave at the signal input while a network analyzer 54 introduces a sine wave input into the frequency sweep 26. The network analyzer 54 provides a phase and amplitude function of frequency.

In order that the frequency of the network analyzer input and output are matched, two mixers 56 and 58 are provided. One of these mixers 56 parallels the function of the translation mixer 46, stepping the input up by the translation frequency. The lower sideband of the mixer 56 is rejected by the following filter 60, which thus parallels the filtration function of the second RAC 14.

The spectrum analyzer output is mixed with the translated reference output of the filter 60 and the other added filter 62 rejects the upper sideband of the mixer 58. The retained lower sideband is at the frequency of the network analyzer output. The network analyzer 54 determines the amplitude and phase changes in its signal and the results are stored in the computer. This process is iterated through small frequency steps through the range of the frequency sweep. The result is a phase shift and amplitude function of frequency stored in a computer 64.

Preferably, the network analyzer 54 is used to determine the transfer characteristics of the second added filter 62. The resulting phase and amplitude function is then subtracted by the computer from the system transfer characteristic. In this way, any distortions introduced by the filter 62, which is not part of the spectrum analyzer, are ignored in determining the calibration function.

The purpose of the calibration function is to predistort the incoming signal so as to minimize intersymbol interference in the TDM output. Intersymbol interference can be minimized where the individual pulses have a frequency distribution corresponding to a Kaiser-Bessel weighting function W(f). In the illustrated embodiment a Kaiser-Bessel window with a=1.7156 is used.

The transfer function determined by the network analysis is characterized in terms of complex Legendre Polynomials and the linear phase term is subtracted. Then this modified transfer characteristic of the converter is expanded in a set of polynomials $R_i(f)$, where is the set of nonnegative integers. The R polynomials satisfy the following conditions:

$$\int_{-\frac{1}{2}}^{+\frac{1}{2}} W(f)R_o(f)df = 1$$

$$\int_{-\frac{1}{2}}^{+\frac{1}{2}} W(f)R_n(f)R_m(f)df = \begin{cases} 1 & n = m \\ 0 & n \neq m \end{cases}$$

Experience has shown that where the linear phase term is removed, as above, fewer than ten term are required to represent the transfer characteristic. A correction exponent is then formed:

$$C_oR_o(f,t) \times [C_oR_o(f,t) + C_1R_1(f,t) + \ldots + C_9R_9(f,t)]^{-1}$$

The coefficients are derived from the integral over the system pass band of the weighted signal function and the R polynomials, i.e.

$$C_k = \int_{f_1}^{f_2} S(f)W(f)R_k(f)df$$

Note that if S(f) is complex, $C_k$ is a complex constant.

The calibration function is the natural logarithm, e, raised to the correction exponent. In the illustrated embodiment, the correction factor is evaluated at 128 times during a symbol period and applied to the incoming signal the same number of times. The calibration function is stored in the memory 34 in the form of complex digital words, and fed to the complex multiplier 32 in response to timing and address cues from the address generator 36. The address generator 36 itself responds to system timing information from the communications system incorporating the spectrum analyzer. The calibration function can be checked by resetting the frequency synthesizer 52 at different points in the passband of the first RAC 12.

In accordance with the foregoing, a high time-bandwidth product radio frequency analog spectrum analyzer incorporates a calibration section to compensate for distortions introduced by analog dispersion sections. The invention provides for many alternatives including, analog instead of digital representation of the calibration function and different location of the calibration section, are available. Also, the functions performed by single RACs can be distributed among plural RACs or performed by different dispersion means. Accordingly, the scope of the invention is limited only by the following claims.

What is claimed is:

1. A spectrum analyzer comprising:
   means for receiving an input signal having plural frequency bands each conveying a signal with successive symbol segments;
   a first analog dispersion means coupled to the receiving means for introducing differential delays in to said input signal as a first nominal monotonic delay function of frequency, said first analog dispersion means being characterized by a first actual delay function of frequency so as to stagger concurrently received signal segments;
   a frequency sweep section for multiplying the staggered signal segments signal by a predetermined frequency sweep so as to produce a series of frequency sweep signals;
   a second analog dispersion means for introducing differential delays as a second nominal function so as to collapse into a pulse a frequency sweep signal which is calculated to result from a signal input processed according to said first nominal function and said predetermined frequency sweep, said second analog dispersion means being characterized by a second actual delay function of frequency; and
   a calibration section for compensating for deviations in said first and second actual delay functions from said first and second nominal delay functions so that the output of said second analog disperson means is substantially that calculated for a system in which said actual delay functions are equal to said nominal functions.

2. The spectrum analyzer of claim 1 further characterized in that said calibration section modifies said input signal prior to its input to said first dispersion means.

3. The spectrum analyzer of claim 1 further characterized in that said dispersion means include reflective acoustic coupler devices.

4. The spectrum analyzer of claim 3 further characterized in that said calibration section multiplies said multiplexed signal by a sequence of complex digital words.

5. The spectrum analyzer of claim 1 further characterized in that said input signal is a frequency division multiplexed signal, the output of said spectrum analyzer being a time division multiplexer signal.

* * * * *